United States Patent
Souma (10) Patent No.: US 7,768,752 B2
(45) Date of Patent: Aug. 3, 2010

(54) OVERVOLTAGE PROTECTION CIRCUIT

(75) Inventor: Osamu Souma, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 652 days.

(21) Appl. No.: 11/483,757

(22) Filed: Jul. 11, 2006

(65) Prior Publication Data

US 2007/0014064 A1 Jan. 18, 2007

(30) Foreign Application Priority Data

Jul. 14, 2005 (JP) .............................. 2005-205330

(51) Int. Cl.
*H02H 9/00* (2006.01)
(52) U.S. Cl. ...................................................... 361/56
(58) Field of Classification Search .................... 361/56
See application file for complete search history.

(56) References Cited

U.S. PATENT DOCUMENTS 5,162,966 A * 11/1992 Fujihira ...................... 257/140

FOREIGN PATENT DOCUMENTS

JP 2005-109162 4/2005

OTHER PUBLICATIONS

English translation of JP 2005-109162.*
Nakaharra Akihiro, English translation of JP 2005-109162 A, Apr. 21, 2005, NEC Electronics Corp.*

* cited by examiner

*Primary Examiner*—Jared J Fureman
*Assistant Examiner*—Nicholas Ieva
(74) *Attorney, Agent, or Firm*—McGinn IP Law Group PLLC (57) ABSTRACT

An overvoltage protection circuit includes an output transistor connected between a first power supply and an output terminal, a load connected to the output terminal, a dynamic clamping circuit for controlling a voltage difference between the first power supply and the output terminal, and a clamp selection switch electrically connected between the dynamic clamping circuit and the output terminal, and a conductive condition of the clamp selection switch is determined according to a comparison between a reference voltage and a voltage of the output terminal.

9 Claims, 5 Drawing Sheets

RELATED ART

Fig. 3

RELATED ART

Fig. 4

RELATED ART

Fig. 5

RELATED ART

OVERVOLTAGE PROTECTION CIRCUIT

BACKGROUND OF THE INVENTION

1. Field of the Invention

The present invention relates to an overvoltage protection circuit, and more particularly to an output stage MOS transistor overvoltage protection circuit for driving an inductance load.

2. Description of Related Art

Recently there are growing demands for increasing a withstand voltage of surge destruction for a power switch to be installed to a car. For example an inductance (L) load such as solenoid or an inductance element of wire harness is connected to an output stage of a power switch to be installed to a car. If L load is connected to an output stage of a power switch, a back electromotive force is generated on turn-off, thereby applying a negative surge voltage to an output terminal. If a voltage of the negative surge voltage exceeds the withstand voltage to destruction of an output stage transistor of a power switch, the output stage transistor breaks down and a breakdown current flows. An output stage transistor may deteriorate due to this breakdown current. Therefore the power switch protects the output stage transistor from an overvoltage generally using an overvoltage protection circuit (for example a dynamic clamping circuit). An example of the overvoltage protection circuit according to a conventional technique is shown in FIG. 2.

Figure 2:
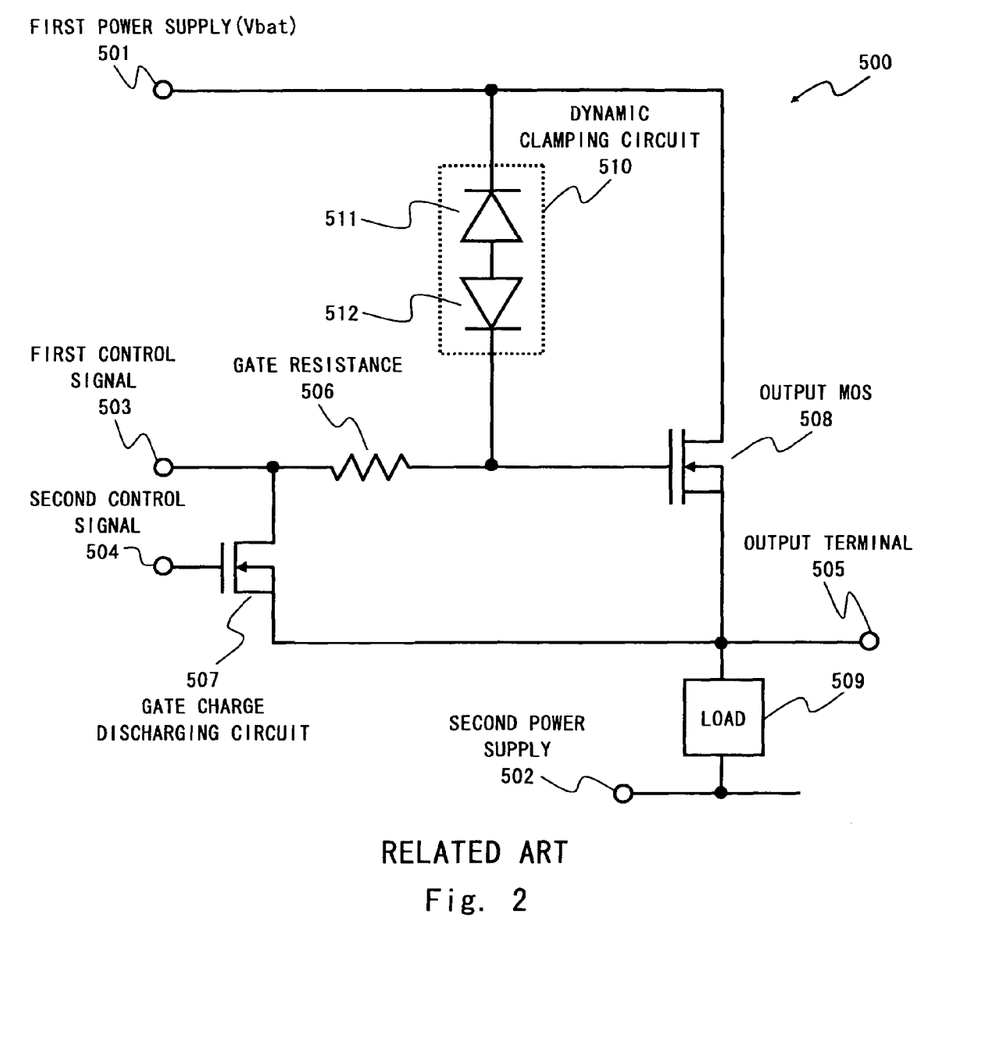
FIG. 2 is a view showing an overvoltage protection circuit according to a conventional technique.

In an overvoltage protection circuit 500 of the conventional technique shown in FIG. 2, a drain of an output MOS transistor 508 is connected to a first power supply (for example battery voltage, Vbat) 501. A source of the output MOS transistor 508 is connected to a second power supply 502 via a load 509. An output terminal 505 is connected to a node between the output MOS transistor 508 and the load 509. One terminal of a gate resistance 506 is connected to a gate of the output MOS transistor 508. A first control signal 503 is inputted to another terminal of the gate resistance 506.

A gate charge discharging circuit 507 is connected between another terminal of the gate resistance 506 and the output terminal 505. The gate charge discharging circuit 507 uses one MOS transistor. A drain of the MOS transistor is connected to the gate resistance 506, its source is connected to the output terminal 505, and a second control signal 504 is inputted to its gate. A dynamic clamping circuit 510 is connected between the gate of the output MOS transistor 508 and the first power supply 501. In the dynamic clamping circuit 510, a zener diode 511 and a diode 512 are connected in series.

The overvoltage protection circuit 500 controls the output MOS transistor 508 to be conductive or non-conductive condition by a first control signal 503. If the output MOS transistor 508 is non-conductive, the gate charge discharging circuit 507 becomes conductive by the second control signal 504 to discharge a charge in the gate. That is, the first control signal 503 is reversed phase with the second control signal 504.

Figure 3:
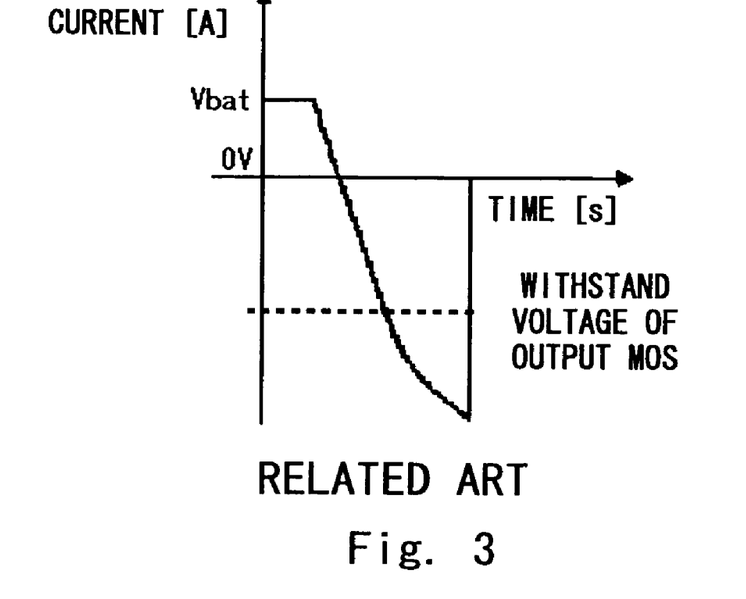
FIG. 3 is a graph showing a voltage waveform of a negative voltage surge.

If the output MOS transistor 508 is turned off and the load 509 includes L element, a back electromotive force as shown in FIG. 3 is generated. The overvoltage protection circuit 500 protects the output MOS transistor 508 by operating the dynamic clamping circuit 510 if such back electromotive force is generated.

A protection operation as mentioned above is described hereinafter in detail. If a back electromotive force is generated and a negative voltage is generated in the output terminal 505, a voltage in the gate of the output MOS transistor 508 also becomes negative because the gate charge discharging circuit 507 is conductive. In a case a voltage difference between the negative voltage and the voltage of the first power supply 501 becomes larger than a specified dynamic clamp voltage, the dynamic clamping circuit operates, and a voltage between the drain and the gate of the output MOS transistor 508 is restricted to the dynamic clamp voltage. The output MOS transistor 508 is conductive at this time. Accordingly the voltage between the drain and the source of the output MOS transistor 508 is add the dynamic clamp voltage to a threshold voltage of the output MOS transistor 508. Therefore, a device can be protected from overvoltage by controlling the voltage between the source and the drain of the output MOS transistor 508, while flowing a current in the load 509 using a channel resistance of the output MOS transistor 508.

Figure 4:
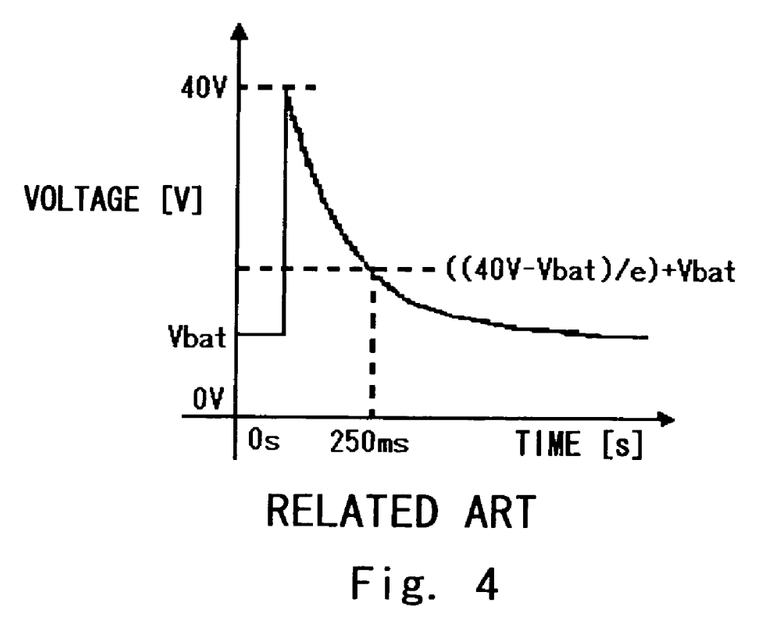
FIG. 4 is a graph showing a voltage waveform of a dump surge.
Figure 5:
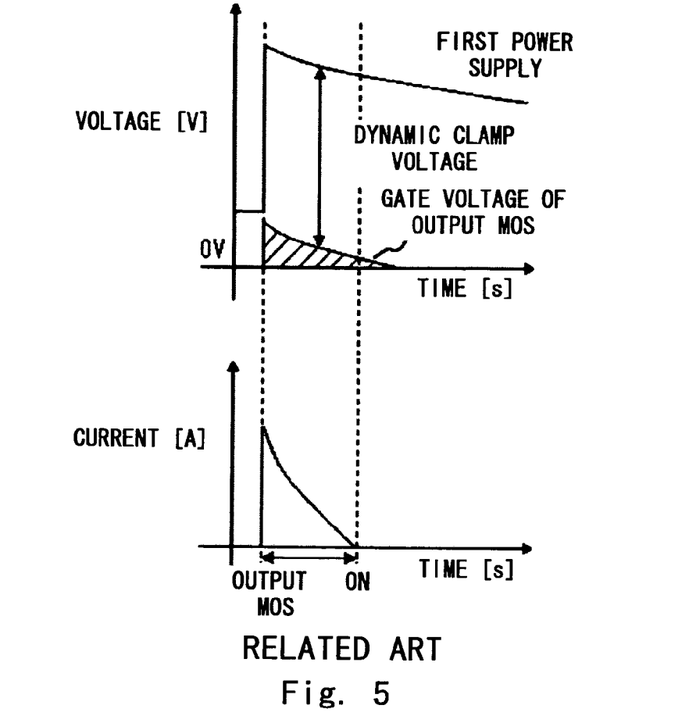
FIG. 5 is a view showing a relationship between a dump surge and a dynamic clamp voltage.

However in the overvoltage protection circuit 500, the first power supply 501 may be applied by a surge called a dump surge. The dump surge is a surge applied to the first power supply 501 as a positive voltage, in a case a battery terminal is disconnected while generating electricity for an alternator. The dump surge is shown in FIG. 4. If the surge voltage is higher than the dynamic clamp voltage, the output MOS transistor 508 becomes conductive. This causes a large current to flow in the output MOS transistor 508, creating possibility for thermal destruction. A relationship between a first power supply 501 and a gate voltage of the output MOS transistor 508 in a case the dump surge voltage is higher than the dynamic clamp voltage, and a current that flows in the output MOS transistor 508 at such times are shown in FIG. 5. In the shaded area of FIG. 5, the gate voltage of the output MOS transistor 508 is rising. Further, a large current is flowing to the output MOS transistor 508 during the shaded period.

Figure 6:
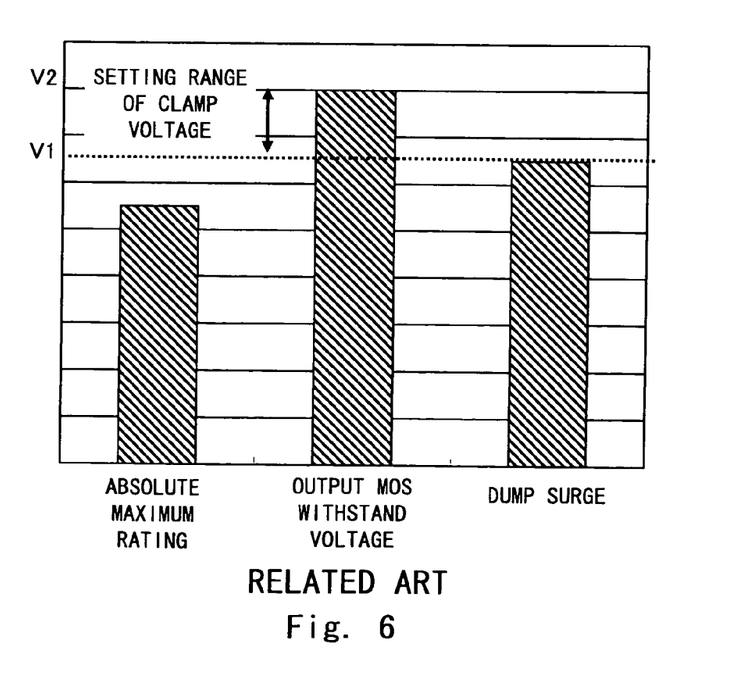
FIG. 6 is a graph showing a relationship between an absolute maximum rating, a withstand voltage of an output MOS, and a dump surge voltage.

To resolve the abovementioned problem, configurations of the dynamic clamp voltage must satisfy the following conditions;

(1) Withstand voltage of the output MOS transistor>Dynamic clamp voltage>Dump surge voltage (2) Dump surge voltage>Absolute maximum rating However if there is no difference between the dump surge voltage and a withstand voltage of the output MOS transistor, it is difficult to appropriately configure the dynamic clamp voltage due to variations in production tolerance of the dynamic clamping circuit 510. The relationship of the voltages is shown in FIG. 6. An overvoltage protection circuit according to another conventional technique that is not restricted by the abovementioned condition (1) is disclosed in the Japanese Unexamined Patent Application Publication No. 2005-109162. An overvoltage protection circuit 600 of another conventional technique is shown in FIG. 7.

Figure 7:
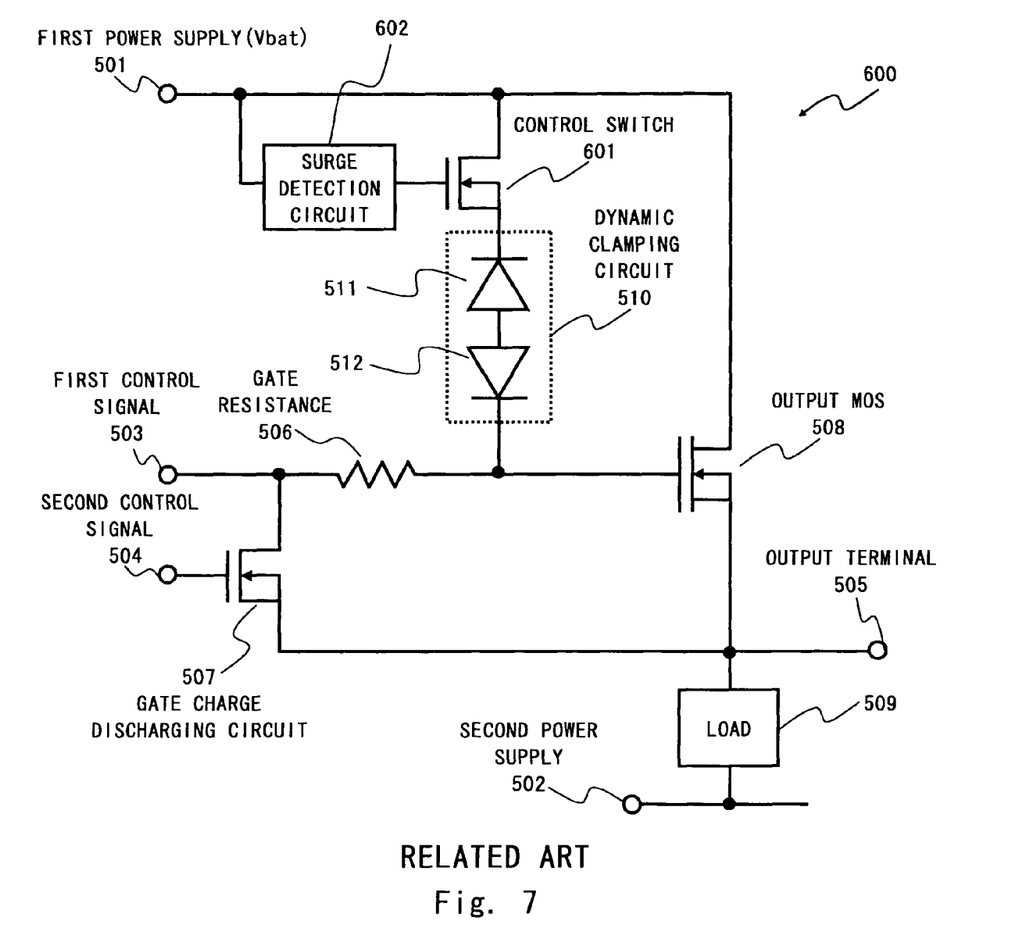
FIG. 7 is a view showing an overvoltage protection circuit according to another conventional technique.

As shown in FIG. 7, in the overvoltage protection circuit 600 as compared to the overvoltage protection circuit 500, a control switch 601 is connected between the dynamic clamping circuit 510 and the power supply 501. Further, the surge detection circuit 602 for controlling the control switch 601 is connected between a gate of the control switch 601 and the first power supply 501. The surge detection circuit 602 is a circuit for detecting a dump surge voltage higher than the dynamic clamp voltage. Further, the control switch 601 is a switch that becomes non-conductive if the surge detection circuit 602 detects a dump surge voltage higher than the dynamic clamp voltage.

The overvoltage protection circuit 600 practically operates in the same way as the overvoltage protection circuit 500 as for the negative voltage surge. If a dump surge is applied, the surge detection circuit 602 detects a dump surge voltage to make the control switch non-conductive, so that the dynamic clamping circuit 510 does not operate.

Accordingly if a dump surge voltage higher than the dynamic clamp voltage is applied to the first power supply 501, the dynamic clamping circuit 510 can be disabled, accordingly the output MOS transistor 508 will not be conductive. Therefore, a large current does not flow in the output MOS transistor 508, enabling to prevent the output MOS transistor 508 from thermal destruction. Withstand voltage to destruction for the output MOS transistor 508 is designed to be higher than the dump surge voltage, thus the output MOS transistor 508 will not be destroyed.

Further, the surge detection circuit 602 detects a dump surge voltage higher than the dynamic clamp voltage and disables the dynamic clamping circuit 510. It is therefore not restricted by the above condition (1) in a configuration of the dynamic clamp voltage.

However even with the overvoltage protection circuit 600, if there is no difference in the absolute maximum rating and the dynamic clamp voltage, there still remains a problem in a circuit operation. For example, if the dynamic clamp voltage fluctuates to a lower voltage, the surge detection voltage becomes higher than an actual dynamic clamp voltage. Accordingly there is a possibility that the dynamic clamping circuit 510 unintendedly operates even with a dump surge voltage lower than the absolute maximum rating, and eventually the dynamic clamping circuit 510 is destroyed by the dump surge. There is another problem that the number of devices in a circuit increases because a logic circuit is required for the surge detection circuit 602.

SUMMARY OF THE INVENTION

According to an aspect of the present invention, there is provided an overvoltage protection circuit that includes an output transistor connected between a first power supply and an output terminal, a load connected to the output terminal, a dynamic clamping circuit for controlling a voltage difference between the first power supply and the output terminal, and a clamp selection switch electrically connected between the dynamic clamping circuit and the output terminal, with its conductive condition determined according to a comparison between a reference voltage and a voltage of the output terminal.

With the overvoltage protection circuit of this invention, if an output terminal is negative voltage as a result of a comparison between the reference voltage and a voltage of the output terminal, the clamp selection switch becomes conductive to operate the dynamic clamping circuit. No matter what the voltages of the absolute maximum rating and the dump surge voltage are, the dynamic clamping circuit does not operate as long as a negative voltage is generated in the output terminal to make the clamp selection switch conductive.

Accordingly if a negative voltage is generated in the output terminal, the dynamic clamping circuit operates to restrict a voltage between the first power supply and the output terminal to an appropriate dynamic clamp voltage, thereby enabling to protect an output transistor from overvoltage. Further, even if a dump surge is generated, the dynamic clamping circuit does not malfunction.

Moreover, the dynamic clamping circuit does not operate until a negative voltage is generated in the output terminal. Therefore without being restricted by the absolute maximum rating and the dump surge voltage, the dynamic clamp voltage can be configured as desired. This expands a setting range of the dynamic clamp voltage and also facilitates the configuration.

Further, the dynamic clamping circuit and the clamp selection switch can be realized as one device, reducing circuit area.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
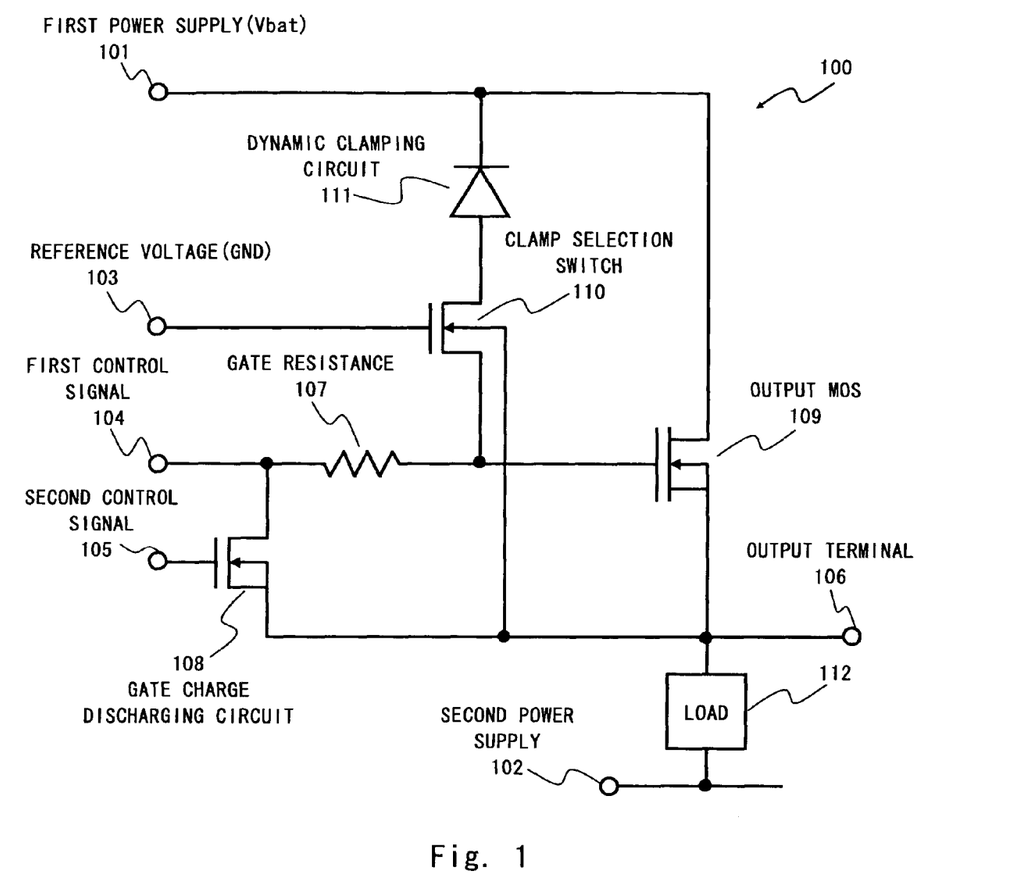
FIG. 1 is a view showing an overvoltage protection circuit according to a first embodiment of the present invention.

An overvoltage protection circuit 100 according to a first embodiment is shown in FIG. 1. As shown in FIG. 1, the overvoltage protection circuit 100 includes a gate charge discharging circuit 108, a gate resistance 107, an output MOS transistor 109, a clamp selection switch 110, a dynamic clamping circuit 111, and a load 112. A connection of the overvoltage protection circuit 100 is described hereinafter in detail.

A first terminal of the output MOS transistor 109 (for example a drain) is connected to a first power supply (for example a battery power supply) 101. A second terminal (for example a drain) is connected to a second power supply (for example a ground potential) 102. An output terminal 106 is connected to a node between the output MOS transistor 109 and the load 112. A control terminal (for example a gate) of the output MOS transistor 109 is connected to one end of the gate resistance 107. To another end of the gate resistance 107, a first control signal 104 is inputted. A gate charge discharging circuit 108 is connected between another end of the gate resistance 107 and the output terminal 106. The gate charge discharging circuit 108 is one MOS transistor in this embodiment. A drain of the gate charge discharging circuit 108 is connected to another end of the gate resistance 107, with its source connected to the output terminal 106. Further, a second control signal 105 is inputted to a gate of the gate charge discharging circuit 108.

A clamp selection switch 110 and the dynamic clamping circuit 111 are connected in series between the gate of the output MOS transistor 109 and the battery power supply 101. In this embodiment, the clamp selection switch is one MOS transistor, and the dynamic clamping circuit 111 is one zener diode.

A source of the clamp selection switch 110 is connected to a gate of the output transistor 109. A drain of the clamp selection switch 110 is connected to an anode of the dynamic clamping circuit 111. A control terminal (for example a gate) is connected to a reference voltage (for example a ground potential) 103. Furthermore in this embodiment, a substrate terminal of the clamp selection switch 110 is connected to the output terminal. A cathode of the dynamic clamping circuit 111 is connected to the battery power supply 101.

The clamp selection switch 110 switches between conductive and non-conductive condition according to a comparison of the two voltages. For example, the clamp selection switch compares a ground potential and a gate voltage of the output MOS transistor 109, and if a voltage difference is higher than a threshold of the MOS transistor, which is the clamp selection switch 110.

The dynamic clamping circuit controls a voltage difference between the anode and the cathode to not more than a specified voltage value (for example a dynamic clamp voltage) if the voltage difference between the anode and the cathode becomes higher or equal to a breakdown voltage of a diode.

The load 112 is an L load that includes an inductance element such as solenoid or an inductance component of wire harness connected to an output terminal.

An operation of the overvoltage protection circuit 100 is described hereinafter in detail. There are three modes in the overvoltage protection circuit 100. Firstly a conductive mode, in which the output MOS transistor 109 becomes conductive, and a voltage is generated in the output terminal 106 by the load 112. Secondly a negative voltage surge mode, in which a negative voltage surge is generated in the output terminal 106 on turn-off, when the output MOS transistor 109 is non-conductive. Lastly a dump surge mode, in which a positive voltage surge (dump surge) is generated in the battery power supply 101 by a battery terminal being disconnected while generating electricity for an alternator. An operation of the overvoltage protection circuit 100 is described in each of the three modes.

Firstly in the conductive mode, if the first control signal 104 becomes high level, the output MOS transistor 109 becomes conductive. A high level first control signal 104 makes the output MOS transistor 109 conductive by a low channel resistance. Thus the high level first control signal 104 is for example a boosted power supply voltage. This causes a voltage to be generated in the load 112, and a voltage to be outputted from the output terminal 106. Further in this case, the gate charge discharging circuit 108 is controlled by the second control signal 105, a reversed phase to the first control signal 104. A low level second control signal 105 is for example a ground potential. In a case the second control signal 105 is low level, the gate charge discharging circuit 108 is non-conductive.

In the conductive mode, the clamp selection switch 110 becomes non-conductive regardless of the gate voltage of the output MOS transistor 109, because a gate voltage of the clamp selection switch 110 is a ground potential. Accordingly the gate of the output MOS transistor 109 is disconnected from the dynamic clamping circuit 111, thereby no current flows from the gate of the output MOS transistor 109 to a side of the battery power supply 101. That is, the clamp selection switch includes a feature to prevent a current from flowing back from the gate of the output MOS transistor 109 to the battery power supply 101.

An operation of the negative voltage surge mode is explained hereinafter in detail. The negative voltage surge is generated on turn-off, when the output MOS transistor 109 is non-conductive. In this case, the first control signal 104 is low level, while the second control signal 105 is high level. Low level of the first control signal 104 is for example a ground potential. High level of the second control signal is for example a voltage of the battery power supply.

If the second control signal 105 is high level, the gate charge discharging circuit 108 is conductive. Accordingly a gate charge of the output MOS transistor 109 is discharged via the gate resistance 107 and the gate charge discharging circuit 108. The output MOS transistor 109 becomes non-conductive at this time, causing L element of the load 112 to generate the negative voltage surge. At this time, the clamp selection switch 110 is electrically connected to the output terminal 106 via the gate resistance 107 and the gate charge discharging circuit 108. The output MOS transistor 109 becomes non-conductive here, causing the L element of the load 112 to generate the negative voltage surge.

When the negative voltage is generated, a voltage of the output terminal 106 decreases. The gate charge discharging circuit 108 becomes conductive at this time. Accordingly the voltage of the output terminal 106 becomes substantially the same as a voltage of the output MOS transistor 109. Thus the voltage of the gate of the output MOS transistor 109 decreases along with a decrease in a voltage of the output terminal 106. If a potential difference between a gate voltage of the clamp selection switch 110 and a gate voltage of the output MOS transistor 109 exceeds a threshold of the clamp selection switch 110, the clamp selection switch becomes conductive. After that, if the gate voltage of the output MOS transistor 109 further decreases and a potential difference between both ends of the dynamic clamping circuit becomes higher or equal to a breakdown voltage of the dynamic clamp circuit, a dynamic clamp voltage is generated in the both ends of the dynamic clamping circuit 111. Moreover, the output MOS transistor 109 becomes conductive. Accordingly a voltage between the drain and the gate of the output MOS transistor 109 is controlled by the dynamic clamp voltage. Further, a voltage between the drain and the source of the output MOS transistor 109 is controlled by a voltage value in which the dynamic clamp voltage is added to a threshold voltage of the output MOS transistor 109.

In this case, the output MOS transistor 109 is conductive, thus a current determined by a resistance element of the load flows between the drain and the source of the output MOS transistor. Specifically, a power consumption of the output MOS transistor 109 will be a current value determined by the dynamic clamp voltage and resistance element of the load. The resistance element of the load is designed in a way that the output MOS transistor 109 is not destroyed by heat due to the power consumption. Further, a current that is calculated by dividing a threshold voltage of the output MOS transistor 109 by a resistance value of the gate resistance 107 flows the dynamic clamping circuit. The current is for example a several dozen μA.

An operation in the dump surge mode is described hereinafter in detail. A dump surge is applied to the battery power supply 101 and a voltage of the battery power supply 101 rises. In this case, the gate voltage of the clamp selection switch is a ground potential and the output terminal 106 is a positive voltage, thereby making the clamp selection switch 110 non-conductive. As the gate of the output MOS transistor 109 is disconnected from the battery power supply 101, the gate voltage of the output MOS transistor 109 is not influenced by a voltage fluctuation of the battery power supply 101. That is, the output MOS transistor 109 is non-conductive.

Accordingly the output MOS transistor 109 is non-conductive, and a voltage between the source and the drain becomes a dump surge voltage. Withstand voltage between the drain and the gate of the output MOS transistor 109 and withstand voltage between the drain and the source are generally designed to be higher than the dump surge voltage, thus the output MOS transistor 109 is not destroyed by the dump surge.

As described in the foregoing, with the overvoltage protection circuit 100 of the first embodiment, the output MOS transistor 109 is protected from the negative voltage surge by making the clamp selection switch 110 conductive to operate the dynamic clamping circuit 111 according to a change in the output terminal 106 in a negative voltage mode. Further, in the conductive mode and the dump surge mode, the clamp selection switch 110 is non-conductive because the output terminal 106 does not generate a negative voltage, thereby disabling the dynamic clamping circuit 111. To be more specific, the overvoltage protection circuit 100 protects the output MOS transistor 109 by the dynamic clamping circuit in a case the voltage of the output terminal 106 is negative. In other modes, the overvoltage protection circuit prevents from destruction by withstand voltage of the output MOS transistor 109, without using the dynamic clamping circuit.

In the overvoltage protection circuit 600 of a conventional technique, the surge detection circuit 602 monitors a battery power supply. If the surge detection voltage is higher than the absolute maximum rating, the dynamic clamping circuit is disabled if a dump surge is applied, by making the control switch 601 non-conductive. The surge detection circuit needs to detect a dump surge voltage where a voltage of the battery power supply is less or equal to a specified voltage value of the dynamic clamping voltage. Accordingly there is a restriction that the surge detection voltage value of the conventional overvoltage protection circuit 600 must be more than or equal to the absolute maximum rating and less than or equal to the specified value of the dynamic clamp voltage.

As against to the overvoltage protection circuit 600 described in the foregoing, in the overvoltage protection circuit 100 of the first embodiment, the clamp selection switch 110 is non-conductive in the conductive and the dump surge modes. Further, the clamp selection switch 110 is made conductive according to the negative voltage surge of the output terminal 106 that is generated in the negative voltage mode. Therefore the specified value of the dynamic clamp voltage can be specified as desired in consideration of the withstand voltage of the output MOS transistor 109, without being restricted by the absolute maximum rating and the dump surge voltage.

The clamp selection switch 110 included in the overvoltage protection circuit 100 of the first embodiment operates the dynamic clamping circuit in a case the output terminal 106 is below a specified negative voltage as a result of a comparison between a ground potential and the negative voltage of the output terminal 106. Therefore, the dynamic clamping circuit does not malfunction Furthermore with the conventional overvoltage protection circuit 600, a circuit comprising a plurality of devices to form the surge detection circuit 602 is required. Further, two diodes are needed to the dynamic clamping circuit to prevent from a backflow from the gate of the output MOS transistor 508 to the battery power supply.

However in the overvoltage protection circuit 100 of the first embodiment, detection of a negative voltage and a switch is realized by one transistor. In addition, the clamp selection switch 110 is non-conductive in the conductive mode and the dump surge mode, meaning that a current does not flow out from the gate of the output MOS transistor 109 to the battery power supply. The dynamic clamping circuit can therefore be formed by one diode. Accordingly the overvoltage protection circuit 100 needs less circuit area than the conventional overvoltage protection circuit 600.

It is apparent that the present invention is not limited to the above embodiment and it may be modified and changed without departing from the scope and spirit of the invention. For example the dynamic clamping circuit can be enabled by comparing a specified voltage with a voltage of the output terminal using a comparator and detecting a negative voltage of an output terminal. Further, the circuit can be formed with bipolar transistors.

What is claimed is:

1. An overvoltage protection circuit, comprising:
   an output transistor connected between a power supply terminal and an output terminal, the output terminal being a terminal for being connected to a load;
   a dynamic clamping circuit to control a voltage difference between the power supply terminal and the output terminal according to a voltage of the output terminal; and
   a clamp selection switch electrically connected between the dynamic clamping circuit and the output terminal, the clamp selection switch including an N-channel type MOS transistor including:
      a gate terminal applied to a ground terminal;
      a substrate terminal electrically connected to the output terminal;
      a drain terminal connected to the dynamic clamping circuit; and
      a source terminal connected to a gate terminal of the output transistor.

2. The overvoltage protection circuit according to claim 1, further comprising:
   a gate resistance; and
   a gate charge discharging circuit connected between the gate terminal of the output transistor and the output terminal,
   wherein the gate charge discharging circuit is conductive to discharge a charge in the . gate terminal of the output transistor.

3. The overvoltage protection circuit according to claim 2, wherein the gate charge discharging circuit is controlled by a second control signal which is an inverted signal of a first signal for controlling the output transistor.

4. The overvoltage protection circuit according to claim 1, wherein the dynamic clamping circuit comprises a diode,
   wherein a cathode of the diode is connected to the first power supply, and
   wherein an anode of the diode is connected to the clamp selection switch.

5. The overvoltage protection circuit according to claim 1, wherein the output transistor is controlled by a first control signal inputted via a gate resistance.

6. The overvoltage protection circuit according to claim 1, wherein the output transistor and the dynamic clamping circuit are in the same chip.

7. A power control apparatus, comprising:
a dynamic clamping circuit that controls a voltage difference between a power supply terminal and an output terminal according to a voltage of the output terminal;
an output transistor connected between the power supply terminal and the output terminal, the output transistor comprising an N-channel type MOS transistor, said N-channel type MOS transistor including:
a gate terminal receiving a control signal;
a drain terminal connected to the power supply terminal; and
a source terminal connected to the output terminal; and
a clamp selection switch connected in series with the dynamic clamping circuit and the output terminal, the clamp selection switch including an N-channel type MOS transistor, said N-channel type MOS transistor comprising:
a gate terminal applied to a ground terminal;
a substrate terminal connected to the output terminal;
a drain terminal connected to the dynamic clamping circuit; and
a source terminal connected to the gate terminal of the output transistor.

8. The power control apparatus of claim 7, wherein the output terminal comprises a terminal for being connected to a load.

9. The power control apparatus of claim 8, wherein the control signal is defined as a first control signal, and
wherein the power control apparatus further comprises:
a gate resistance element including a first node connected to the gate terminal of the N-channel type MOS transistor of the output transistor and a second node; and
a gate charge discharging circuit connected between the second node of the gate resistance element and the output terminal, the gate charge discharging circuit comprising an N-channel type MOS transistor, said N-channel type MOS transistor comprising:
a gate terminal receiving a second control signal opposite to the first control signal;
a drain terminal connected to the second node of the gate resistance element; and
a source terminal connected in common with the substrate terminal of the N-channel type MOS transistor of the clamp selection switch and the output terminal, and
wherein the source terminal of the N-channel type MOS transistor of the clamp selection switch is further connected to the first node of the gate resistance element.

* * * * *